United States Patent [19]
Hoshino

[11] Patent Number: 5,317,539
[45] Date of Patent: May 31, 1994

[54] DYNAMIC RANDOM ACCESS MEMORY FOR VIDEO

[75] Inventor: Yasuharu Hoshino, Tokyo, Japan

[73] Assignee: NEC Corporation, Tokyo, Japan

[21] Appl. No.: 905,418

[22] Filed: Jun. 29, 1992

[30] Foreign Application Priority Data

Jun. 27, 1991 [JP] Japan .................. 3-183104

[51] Int. Cl.⁵ .................. G11C 11/407; G06F 12/00
[52] U.S. Cl. .................. 365/207; 365/206; 365/189.09; 365/189.04; 365/189.01
[58] Field of Search .................. 365/182, 189.04, 206, 365/189.01, 189.09, 207

[56] References Cited

FOREIGN PATENT DOCUMENTS 0520450 12/1992 Japan .

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

A semiconductor memory includes a memory cell array having a plurality of memory cells, a plurality of bit line pairs and word lines, a sense amplifier connected to each member of the bit line pair, a transfer gate provided between one end of the bit line and the sense amplifier, and a potential supply circuit connected respectively to the bit line pairs between the sense amplifiers.

7 Claims, 4 Drawing Sheets

DYNAMIC RANDOM ACCESS MEMORY FOR VIDEO

BACKGROUND OF THE INVENTION

1. Field of the Invention

The present invention relates to a semiconductor memory device, and more particularly, to a semiconductor memory device which is capable of writing a data simultaneously to a plurality of memory cells.

2. Description of the Prior Art

Recently, a dynamic random access memory (DRAM) for video (VRAM) which utilizes the DRAM technology and is suitable as a video memory has been developed and is in widespread use. The arrangement location of a data stored in a VRAM corresponds to a display screen. For example, a data in a memory cell group on the same word line corresponds to one line portion (one scanning line portion) of the display screen. As the case may be, all of the regions for the portion of several lines of the display screen have the same color. In such a case, it takes too long a time if a data is written to each memory cell in order to make these cells to have the same color. To solve this problem, a technology for writing the same data at once to the memory cell group belonging to the same word line has lately been developed.

However, the conventional structure for writing an identical data all at once to the memory cell group belonging to the same word line requires special circuits such as a special purpose circuit for supplying an identical data to every bit line, a special decoder circuit which realizes the simultaneous selection of all of the bit lines or a control circuit which controls the decoder circuit. Along with the increase in the memory capacity, there is generated a problem in that the scale and the area of these circuits are increased correspondingly.

BRIEF SUMMARY OF THE INVENTION

Object of the Invention

It is therefore the object of this invention to provide a semiconductor memory device which makes it possible to write an identical data simultaneously to the memory cell group belonging to the same word line without increasing the circuit scale through an effective use of the existing circuit construction.

Summary of the Invention

The semiconductor memory device according to this invention comprises a memory cell array which includes a plurality of memory cells arranged in array form in row and column directions, a plurality of bit line pairs that respectively connect these memory cells in common for every column and word lines that respectively connect these memory cells in common for every row, a sense amplifier which is connected to each member of the bit line pair at the one ends of the bit line pair for amplifying the potential difference between the pair of bit lines, a transfer gate provided between one end of the bit line and the sense amplifier, the energization thereof being controlled in response to a transfer gate control signal, a reference potential correction circuit connected to each of the bit line pair between the sense amplifier and the transfer gate for supplying a predetermined potential to one bit line member of the bit line pair in response to a reference potential control signal, a transfer gate control signal generation circuit which generates the transfer gate control signal, and a reference potential control signal generation circuit which generates the reference potential control signal, wherein the transfer gate control signal generation circuit is controlled such that during the ordinary operation mode the time at which the transfer gate control signal is brought to an active level occurs later than the time at which a predetermined one of the word lines is selected, whereas during a simultaneous write mode the time at which the transfer gate control signal is brought to the active level occurs earlier than the time at which the predetermined word line is selected, and the reference potential control signal generation circuit is controlled so as to generate during the ordinary operation mode a reference potential control signal having a potential level that corresponds to a correction potential in one bit line member of the bit line pair, whereas it generates during the simultaneous write mode a reference potential control signal having a potential level that corresponds to a simultaneous write data.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Figure 1:
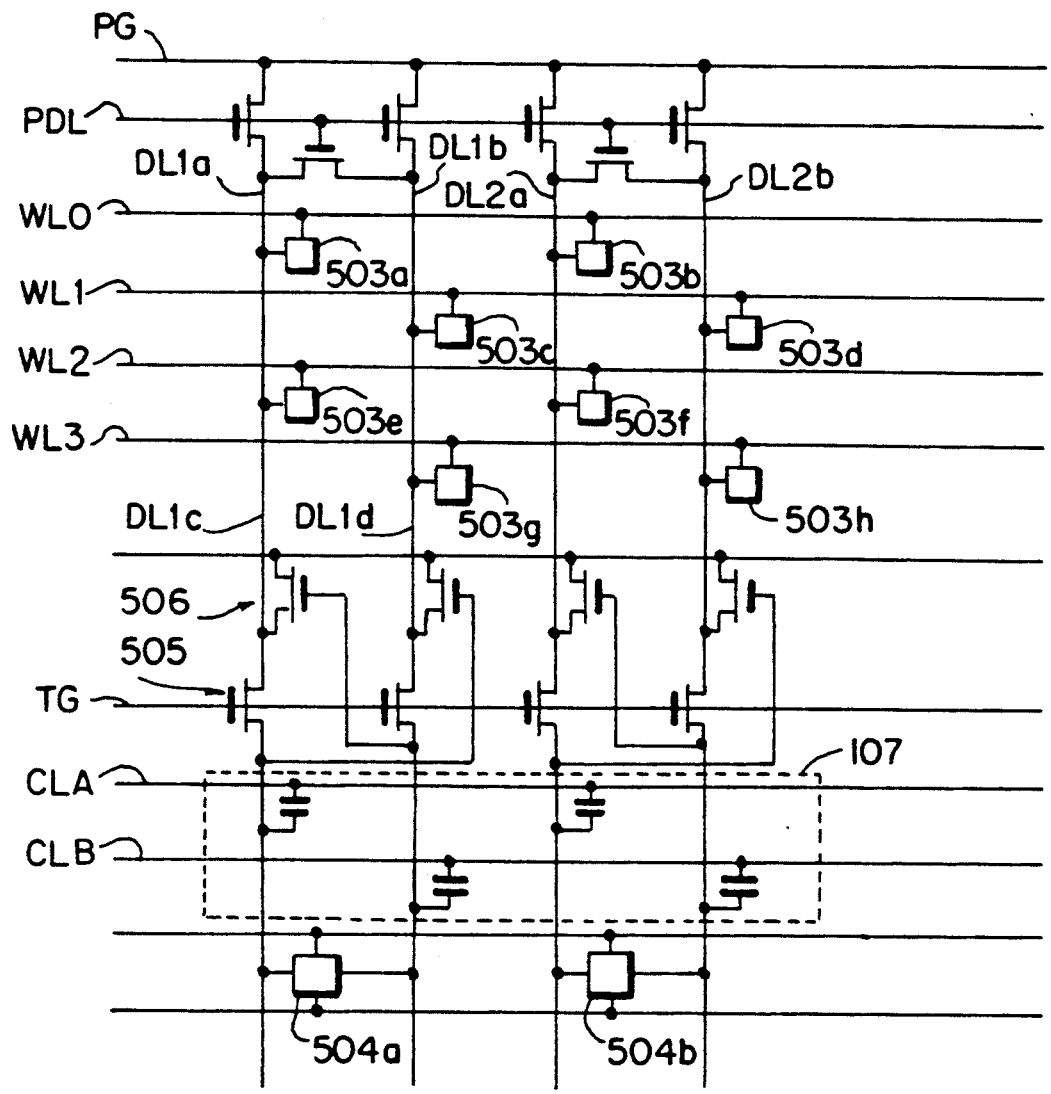
FIG. 1 is a circuit diagram for the semiconductor memory device for describing an embodiment of the invention.

Referring to FIG. 1, an embodiment of this invention will be described. In this embodiment, description will be given about a partial region of the memory cell array which consists of four lines each of word lines and digit lines and eight memory cells as an example to facilitate the description.

Word lines WL0 to WL3 and digit lines DL1$a$, DL1$b$, DL2$a$, and DL2$b$ are respectively arranged so as to be orthogonal with each other, and memory cells 503$a$ to 503$h$ are arranged at every other intersection of these lines. Each of these memory cells is constituted of one transistor and one capacitor element (not shown). The digit lines DL1$a$ to DL2$b$ are used respectively as sets of two lines. Information in a memory cell connected to one word line arbitrarily selected appears in lines on one side of the digit lines DL1$a$ to DL2$b$ that are grouped in pairs. Namely, the potential of one of the digit line pair is raised or lowered in response to the information in the memory cell. For example, the variation of the potential for a power supply voltage of 5V is 300 to 600 mV. This change in the potential affects the information quantity of the memory cells 503$a$ to 503$h$, and the stray capacitance of the digit lines DL1$a$ to DL2$b$. In order to take out this minute potential change as a digital information by amplifying it, positive feedback type operational amplifiers (sense amplifiers) 504a and 504b by means of a flip-flop or the like are provided. Further, the digit lines DL1a to DL2b are connected to a pre-charge power supply line PG via a plurality of transistors which form the transfer gates whose control terminals are connected respectively to a pre-charge control line PDL. In addition, there are provided a feedback circuit 506 for cutting down the peak current at the time of restoring of information to the memory cells 503a to 503h, and a transfer gate 505 for isolating the stray capacitance of the digit lines DL1a to DL2b which becomes a factor of delay in the amplification speed at the time of amplification of the differential potential.

The constitution that has been described so far is the same as in the conventional semiconductor memory device. The difference between the constitution of this embodiment and that of the prior art is as in the following. First, a reference potential correction circuit 107 is connected between the respective bit lines and a reference potential control line CLA or CLB in order to correct the unbalance of the operating margin that is generated in the degradation of the information quantity of the memory cell caused by α rays or the leakage current due to its difference at the times of rise and fall of the digit line potential. What is important here is the fact that in contrast to the provision of a reference potential correction circuit at a location closer to the side of the memory cell array than the transfer gate 505, namely, at a location substantially the same as that of the feed-back circuit 506, in the prior art, the reference potential correction circuit 107 is provided between the transfer gate 505 and the sense amplifiers 504a and 504b in this embodiment. Moreover, at the time of simultaneous write mode, the time of closing the transfer gates 505 is earlier than the time of selecting a word line. This operation will be described in more detail later.

Figure 2:
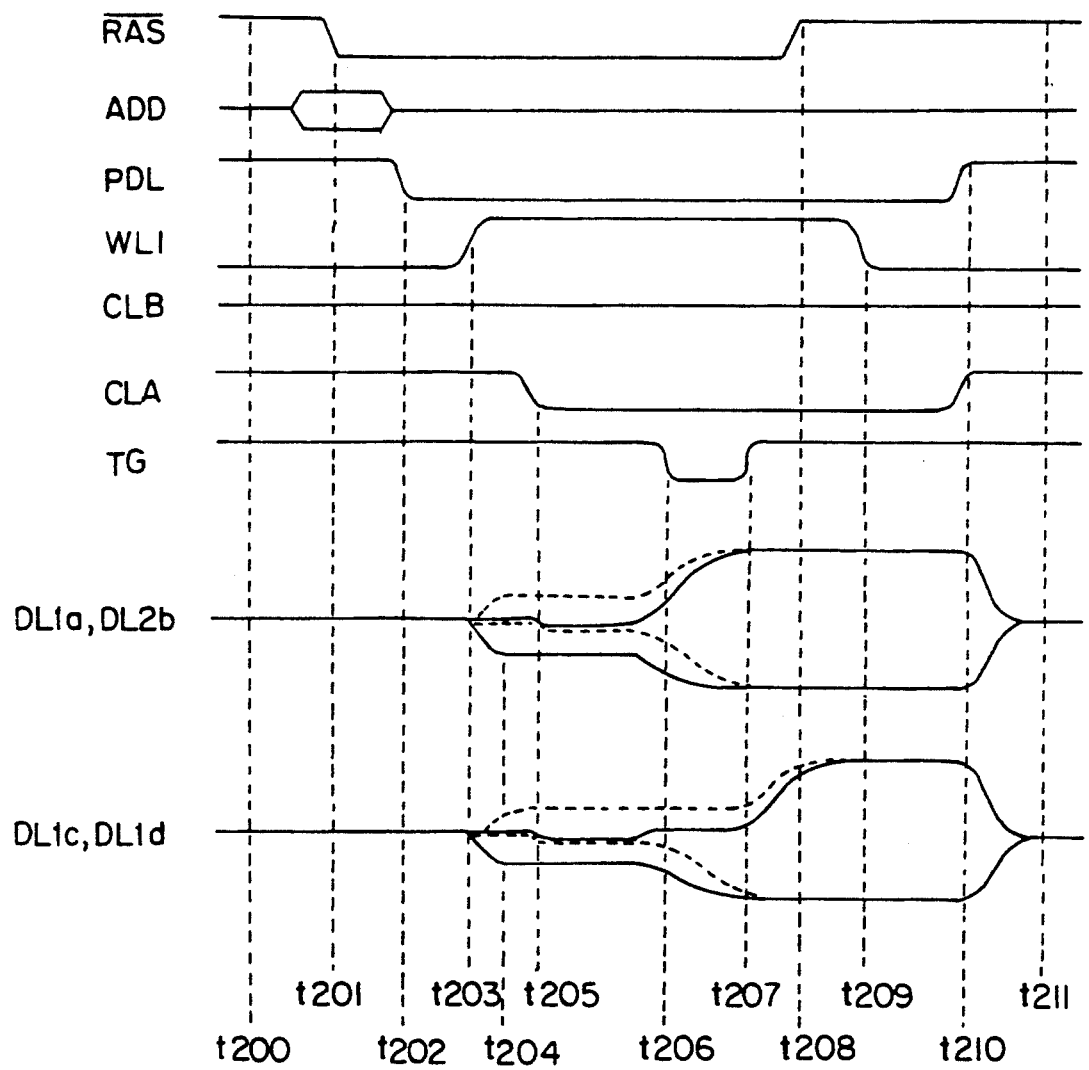
FIG. 2 is an operating waveform diagram of the semiconductor memory device shown in FIG. 1 during the ordinary refresh mode.

First, referring also to FIG. 2, the ordinary refresh operation will be described. Since, in the standby state, all of the word lines are in the nonselect state and the potential of the pre-charge control line PDL is at a high level (at the time t 200), the digit lines DL1a to DL2b are connected to the pre-charge power supply line PG all to be at the potential same as that of the pre-charge potential. Next, the address ADD of the word line to be refreshed is given, and the refresh operation is started by bringing an external signal $\overline{RAS}$ to a low level (at the time 201).

Then, the potential of the pre-charge control line PDL is lowered and the digit lines DL1a to DL2b are disconnected from the precharge power supply line PG to be in the floating state (at the time t202). Subsequently, when the word line (WL1, for example) corresponding to the address information given to the address signal ADD is selected (at the time t203), the memory cells 503c and 503d are connected to the digit lines DL1b and DL2b and the potential of the digit line is raised or lowered (see the dotted line in the figure).

At this time, the potentials of the other members of the pairs, DL1a and DL2a, do not undergo a change so that there are generated potential difference between the digit lines DL1a and DL1b and between DL2a and DL2b (at the time t204). At the same time, the digit lines DL1a to DL2b and the sense amplifiers 504a and 504b are connected electrically since the transfer gate 505 is open, and the above-mentioned potential differences are transferred as they are to the sense amplifiers. Since the potential difference tends to aggravate the operating margin of the side where the potential is raised by the aforementioned reason, the potentials of the digit lines DL1a and DL2a that are not connected to the memory cells 503c and 503d are controlled to be somewhat lower than the potential of the reference potential correction circuit 107 by means of the potential changes in the reference potential control lines CLA and CLB (at the time t205).

Next, in the midst of amplifying these potential differences by the sense amplifiers, the transfer gate 505 is closed, the amplification operation is carried out at high speed by disconnecting the digit lines DL1a to DL2b from the sense amplifiers 504a and 504b, and the restore operation to the memory cells 503c and 503d by the feedback circuit 506 is started (at the time t206).

When the amplification operation by the sense amplifiers executed thoroughly, the transfer gate 505 is opened again, and the sense amplifiers 504a and 504b also carry out the restore operation to the memory cells 503c and 503d (at the time t207). At the time when the restore to the memory cells proceeded sufficiently well, the external signal $\overline{RAS}$ is returned to the high level (at the time t208), the memory cells 503c and 503d are disconnected from the digit lines DL1a to DL2b by returning the word line WL1 to the nonselected state (at the time t209), the digit line is precharged (at the time t210), and returns to the standby state (at the time t211).

What is described in the above represents the ordinary refresh operation.

Figure 3:
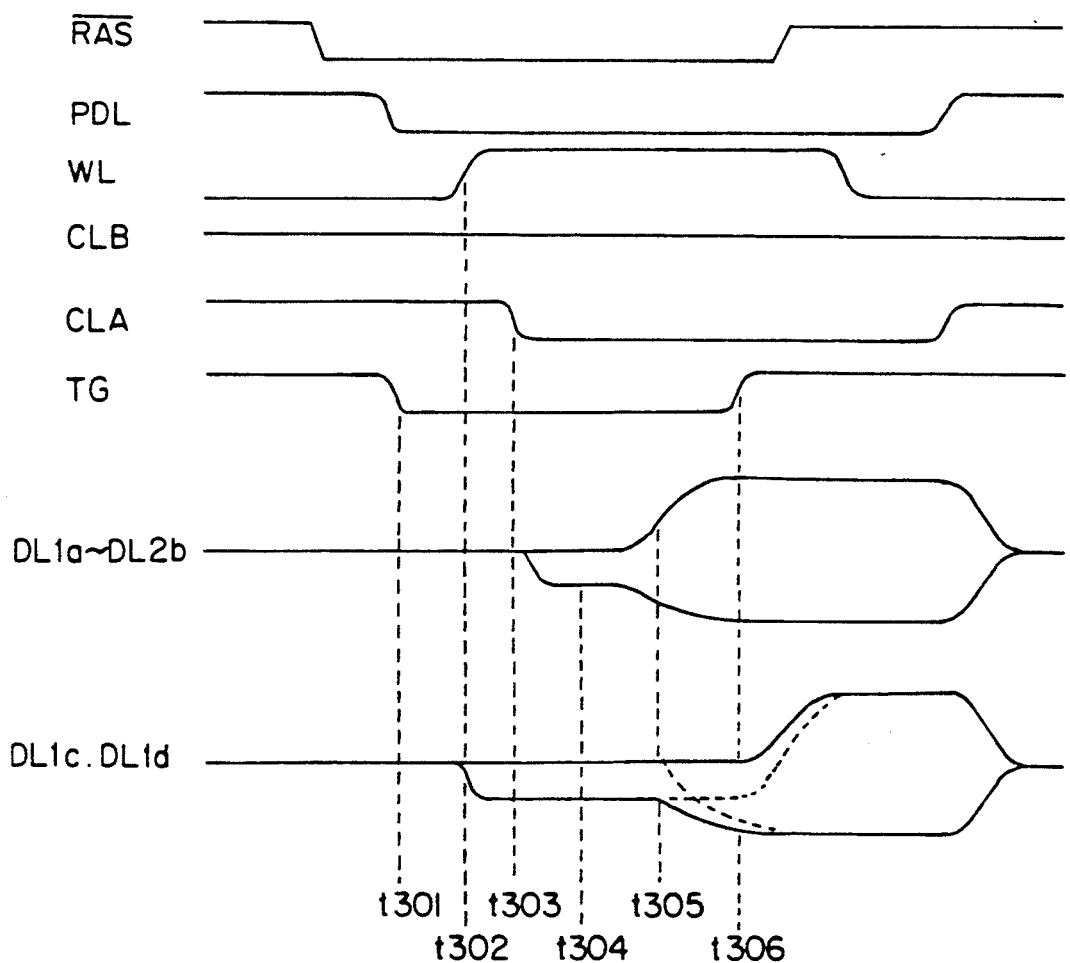
FIG. 3 is an operating waveform diagram of the semiconductor memory device shown in FIG. 1 during the simultaneous write mode.

Next, referring to FIG. 3, the operation of the mode of writing an identical data all at once to the memory cells that are connected to a certain word line, namely, the simultaneous writing mode, which is the feature of this invention will be described.

In this mode, the time (t301) at which the transfer gate is closed comes earlier than the time (t302) at which the word line WL1 is selected. The order of this operation is the opposite to that of the ordinary refresh operation described in the above. Accordingly, in this mode, information in the selected memory cells 503c and 503d will never be transferred to the sense amplifiers 504a and 504b.

A reference potential correction circuit 107 is operated in the state where the transfer gate 505 is closed (at the time t303). At this time, the reference potential correction circuit 107 causes the potentials of the reference potential control lines CLA and CLB in response to the data desired to be written to the memory cells. Consequently, potential differences corresponding to the potentials of the reference potential control lines CLA and CLB will be input to the input ends of the sense amplifiers 503c and 503d. In this case, the potential difference is greater in proportion to the portion unaffected by the capacitance of the digit line, and there is generated a potential difference which is sufficient to operate the sense amplifier (at the time t304). As a result of this operation, the identical data is input to all of the sense amplifiers.

For example, assuming a memory cell capacity of 30fF and a reference potential correcting capacity of 3fF, the potential difference given to the sense amplifier at the time t304 is about 140 mV for a power supply voltage of 5 V.

Next, after amplifying the potential differences generated in the reference potential correction circuit 107 by the sense amplifiers, and operating the feedback circuit 506 (at the time t305), the transfer gate 505 is opened (at the time t306), and the same data are stored simultaneously in the memory cells 503c and 503d. Accordingly, an identical data designated by the reference potential correction circuit 107 is stored in all of the memory cells belonging to one word line that is selected regardless of the data that have been stored there.

Figure 4:
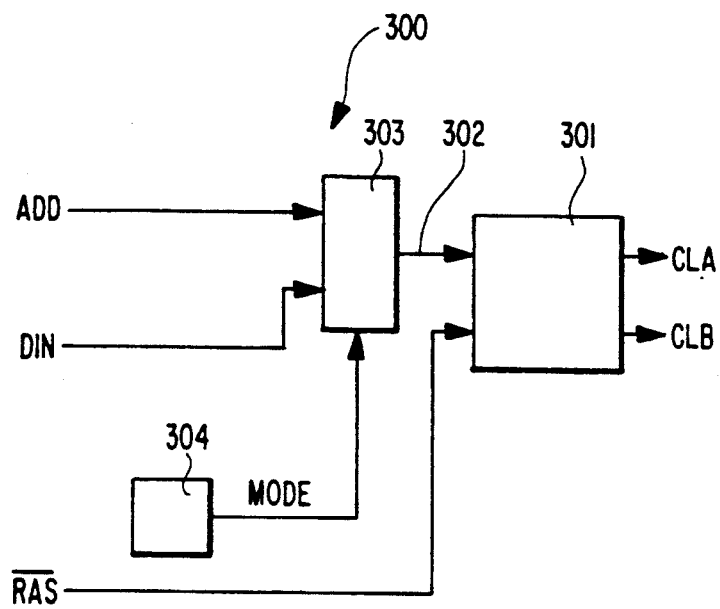
FIG. 4 is a block diagram showing an embodiment of the control part of the reference potential correction circuit.

An example of construction of reference potential control circuit 300 which supplies a predetermined potential to the reference potential control lines CLA and CLB that control the reference potential operation circuit 107 is shown in FIG. 4. In this embodiment, a selection circuit 303 for selecting an address input 302 for a reference potential generation circuit 301 which has been used in the past, is introduced additionally. The selection operation of the selection circuit 303 is controlled by a made decision circuit 304 which outputs a flag signal MODE under a special input signal condition. Namely, when the flag signal MODE is not output, the ordinary address ADD is input to the reference potential generation circuit 301 the same as in the prior art, whereas when the flag signal MODE is output, a data DIN for simultaneous write which is other than the address is input to the reference potential generation circuit 301. The reference potential generation circuit 301 supplies a predetermined potential to the reference potential control lines CLA and CLB in response to the input address 302.

Figure 5:
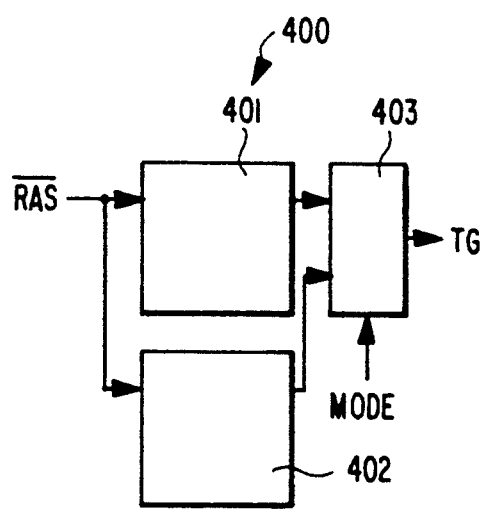
FIG. 5 is a block diagram showing an embodiment of the transfer gate control part.

An example of constitution of a transfer gate control circuit 400 which generates the transfer gate control signal TG that controls the energization of the transfer gate 505 is shown in FIG. 5. In this embodiment, there is provided a special mode signal generation circuit 402 which generates a transfer control signal waveform to be used at the time of simultaneous write mode, separate from a transfer gate control signal generation circuit 401 which has been used in the past. A selection circuit 403 selects the signal from either one of the transfer gate control signal generation circuit 401 or the special mode signal generation circuit 402 in response to the flag signal MODE, and outputs the selected signal as the transfer gate signal TG. Accordingly, at the time of the simultaneous write mode, the transfer gate signal TG output has the waveform of the special mode generation circuit 402, namely, the TG waveform in which the time (t301) at which the transfer gate is closed appears earlier than the time (t302) at which the word line WL1 is selected, as shown in FIG. 3.

As described in the above, this embodiment makes the simultaneous write operation possible for the prior art semiconductor memory device which was incapable of the simultaneous write operation by a mere change of the arrangement position of the reference potential correction circuit 107 and the addition of simple circuits as shown in FIG. 4 and FIG. 5. Consequently, compared with the conventional semiconductor memory device which required a large scale circuit construction for the simultaneous writing, this embodiment makes the simultaneous writing possible by circuit modification which scarcely affect the chip size.

Although the invention has been described with reference to specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the scope of the invention.

I claim:

1. A semiconductor memory device comprising: a memory cell array which includes a plurality of memory cells arranged in array form in row and column directions and a plurality of bit line pairs that respectively connect these memory cells in common for every column and word lines that respectively connect these memory cells in common for every row; a sense amplifier connected to each member of said bit line pair at one end of said bit line pair for amplifying the potential difference between said pair of bit lines; a transfer gate provided between said one end of said bit line and said sense amplifier, the energization thereof being controlled in response to a transfer gate control signal; a reference potential correction circuit connected to each of said bit line pair between said sense amplifier and said transfer gate for supplying a predetermined potential to one bit line member of said bit line pair in response to a reference potential control signal; a transfer gate control signal generation circuit which generates said transfer gate control signal; and a reference potential control signal generation circuit which generates said reference potential control signal, wherein said transfer gate control signal generation circuit is controlled such that during ordinary operation mode the time at which said transfer gate control signal is brought to an active level occurs later than the time at which a predetermined one of said word lines is selected, said transfer gate control signal generation circuit being further controlled such that, during a simultaneous-writing mode in which a plurality of said memory cells are written simultaneously with the same data as each other, the time at which said transfer gate control signal is brought to the active level occurs earlier than the time at which said predetermined word line is selected, and said reference potential control signal generation circuit is controlled so as to generate during said ordinary operation mode a reference potential control signal having a potential level that corresponds to a correction potential in one bit line member of said bit line pair, said reference potential control signal generation circuit being further controlled so as to generate during said simultaneous-writing mode a reference potential signal having a potential level that corresponds to said same data.

2. A semiconductor memory device as claimed in claim 1, wherein said transfer gate control signal generation circuit includes a first signal generation circuit which generates a first signal that is brought to an active level later than the time at which a predetermined word line is selected, a second signal generation circuit which generates a second signal which is brought to the active level earlier than the time at which said predetermined work line is selected, and a selection circuit which selects and outputs either one of said first signal or said second signal as said transfer gate control signal in response to whether said device is in said ordinary operation mode or in said simultaneously-writing mode.

3. A semiconductor memory device as claimed in claim 1, wherein said reference potential control signal generation circuit includes a first control signal generation circuit which generates a first control signal having a potential level that corresponds to the correction potential, a second control signal generation circuit which generates a second control signal that corresponds to the said same data, and a selection circuit which selects and outputs either one of said first control signal or said second control signal as said reference potential control signal is response to whether said device is in said ordinary operation mode or in said simultaneous writing mode.

4. A semiconductor memory device comprising: a memory cell array which includes a plurality of memory cells arranged in array form in row and column directions and a plurality of bit line pairs that respectively connect these memory cells in common for every column and word lines that respectively connect these memory cells in common for every row; a sense amplifier connected to each member of said bit line pair at one end of said bit line pair for amplifying the potential difference between said pair of bit lines; a transfer gate provided between said one end of said bit line and said sense amplifier, the energization thereof being controlled in response to a transfer gate control signal; a reference potential correction circuit connected to each of said bit line pair between said sense amplifier and said transfer gate for supplying a predetermined potential to one bit line member of the bit line pair in response to a reference potential control signal; a first signal generation circuit which generates a first signal that is brought to the active level at a time later than the time at which a predetermined one of said word lines is selected; a second signal generation circuit which generates a second signal that is brought to the active level at a time earlier than the time at which said predetermined word line is select; a first selection circuit which selects and outputs either one of said first signal or said second signal in response to whether said device is in an ordinary operation mode or in a simultaneous write mode in which a plurality of memory cells are written simultaneously with the same data as each other; a third control signal generation circuit, which generates a third control signal having a potential level that corresponds to a correction potential; a fourth control signal generation circuit which generates a fourth control signal having a potential level that corresponds to a said same data; and a second selection circuit which selects and outputs either one of said first control signal or said second control signal as said reference potential control signal in response to whether said device is in said ordinary operation mode or in said simultaneous write mode.

5. A semiconductor memory device comprising a memory cell array including a plurality of word lines, a plurality of bit line pairs and a plurality of memory cells each disposed at a different one of intersections of said plurality of word lines and said plurality of bit line pairs, a plurality of signal line pairs, a plurality of sense amplifiers each connected to an associated one of said plurality of signal line pairs, a plurality of transfer gate transistor pairs each connected between an associated one of said plurality of bit line pairs and an associated one of said plurality of signal line pairs, first means for applying a potential difference between each pair of said plurality of signal line pairs which each pair of said plurality of transfer gate transistor pairs is being rendered non-conductive, and second means for rendering each pair of said plurality of transfer gate transistor pairs conductive after one of said word lines is selected and after each of said sense amplifiers amplifies said potential difference between an associated pair of said plurality of signal line pairs.

6. The memory device as claimed in claim 5, wherein each pair of said signal line pairs includes first and second signal lines and said first means includes a first potential control line, a second potential control line, a plurality of first capacitors each connected between said first potential control signal line and said first signal line of an associated pair of said signal line pairs and a plurality of second capacitors each connected between said second potential control line and said second signal line of an associated pair of said signal line pairs.

7. The memory device as claimed as claim 6, further comprising third means for maintaining each pair of said transfer gate transistors conductive when one of said word lines is selected and for rendering thereafter each pair of said transfer gate transistor pairs non-conductive.

* * * * *

UNITED STATES PATENT AND TRADEMARK OFFICE
CERTIFICATE OF CORRECTION

PATENT NO. : 5,317,539
DATED : May 31, 1994
INVENTOR(S) : Yasuharu Hoshino

It is certified that error appears in the above-indentified patent and that said Letters Patent is hereby corrected as shown below:

Column 3, line 43, delete "t 200" and insert --t200--.
Column 3, line 49, delete "201" and insert --t201--.
Column 7, line 30, delete "select" and insert --selected--.

Signed and Sealed this

Thirteenth Day of September, 1994

Attest:

BRUCE LEHMAN

Attesting Officer

Commissioner of Patents and Trademarks